United States Patent [19]
Fujisawa et al.

[11] Patent Number: 5,770,973
[45] Date of Patent: Jun. 23, 1998

[54] SEMICONDUCTOR DEVICE FOR AMPLIFYING AUDIO SIGNALS

[75] Inventors: Masanori Fujisawa; Eiji Nakagawa; Sachito Horiuchi, all of Ukyo-ku, Japan

[73] Assignee: Rohm Co., Ltd., Kyoto, Japan

[21] Appl. No.: 712,456

[22] Filed: Sep. 11, 1996

[30] Foreign Application Priority Data

Sep. 13, 1995 [JP] Japan .................................... 7-260697

[51] Int. Cl.$^6$ .................................................. H03F 3/183
[52] U.S. Cl. ........................................... 330/289; 330/307
[58] Field of Search ................................... 330/256, 266, 330/272, 289, 307

[56] References Cited

U.S. PATENT DOCUMENTS 3,667,064  5/1972  Thornton et al. ................... 330/307 X Primary Examiner—James B. Mullins
Attorney, Agent, or Firm—Fay,Sharpe,Beall,Fagan,Minnich & McKee

[57] ABSTRACT

A semiconductor device for amplifying audio signals of the present invention comprises a preamplifier chip for amplifying small signals representing audio signals; a power amplifier chip which receives and power-amplifies the amplified audio signals from the preamplifier chip and outputs the same ; and a frame where the preamplifier chip and the power amplifier chip are mounted and which includes a heat sink area connected to a terminal for heat radiation, wherein the heat sink area is located adjacent to an area in the frame where the power amplifier chip is mounted, and the preamplifier chip, the power amplifier chip and the frame are packaged together.

7 Claims, 2 Drawing Sheets

SEMICONDUCTOR DEVICE FOR AMPLIFYING AUDIO SIGNALS

BACKGROUND OF THE INVENTION

1. Field of the Invention

The present invention relates to a semiconductor device for amplifying audio signals and more specifically, relates to a semiconductor device for amplifying audio signals which incorporates a preamplifier chip for amplifying small signal audio signals and a power amplifier chip for power amplifying audio signals together into a single package, this allows comparatively large outputs to be generated as well as reducing the S/N ratio of the output signals.

2. Background Art of the Invention

A variety of recent audio devices, for example, micro component stereo devices, car stereo devices, head phone stereos, portable magnetic tape players such as DCCs (Digital Compact Cassette Players) and DATs and portable disk players such as MDs and CDs, are manufactured with external dimensions as small as possible at the same time that their output is increased as much as possible.

A preamplifier in the above mentioned audio devices is designed as an independent circuit and is usually formed into a single chip IC, because a variety of functional circuits such as an equalizer circuits and mixing circuits for amplifying small signals can be integrated. Further, a power amplifier in such audio devices is also designed as an independent circuit and is formed into a single chip IC, The power amplifier is required to have a large output as well as required to integrate a variety of circuits in the power amplifier such as a protecting circuit, a low pass boosting amplifier and further a virtual grounding amplifier.

However, in a case of audio devices such as car stereo devices and micro component stereos a CD player and a magnetic tape player which is to be incorporated into the above devices is frequently received in a single box together with the amplifiers. Therefore, the space for receiving a substrate upon which an IC for the preamplifier and an IC for the power amplifier are mounted is restricted, and with the size reduction of the box for the device the disposition of the substrate into the box becomes difficult.

Accordingly, it is conceivable to incorporate the preamplifier and the power amplifier in a single chip IC, however, the power amplifier generates a significant heat and the input signal for the preamplifier is a small signal. For example, the current is one-several hundreds micro amperes, and the voltage is several milli volts, such that the gain thereof is large. Therefore, when these amplifiers are formed into one chip, signal distortion and cross talk are caused in the preamplifier because of the heat generated at the side of the power amplifier, which deteriorates the audio characteristic of the device concerned.

In a case of a power amplifier with a low output, the power amplifier and the preamplifier are sometimes formed into a single chip IC because of the low heat generation of the power amplifier. However, for the reason indicated above, in a case of audio devices which are required to have a comparatively large output, these two circuits are conventionally constituted into separate ICs.

SUMMARY OF THE INVENTION

An object of the present invention is to resolve the above mentioned problems included in the conventional art and to provide a semiconductor device for amplifying audio signals which reduces thermal interference from a power amplifier to a preamplifier therein, improves the S/N ratio thereof and permits a comparatively large output.

A semiconductor device for amplifying audio signals which achieves the above object is characterized, in that the semiconductor device for amplifying audio signals comprises a preamplifier chip for amplifying small signals representing audio signals, a power amplifier chip which receives and power-amplifiers the amplified audio signals from the preamplifier chip and outputs the same and a frame where the preamplifier chip and the power amplifier chip are mounted. The frame includes a heat sink area connected to a terminal for heat radiation, wherein the heat sink area is located adjacent to an area in the frame where the power amplifier chip is mounted, and the preamplifier chip, the power amplifier chip and the frame are packaged together.

In particular, in case that the area of the heat sink is located at the side of the preamplifier chip, when a linear passage is formed between an area where the preamplifier chip is located and the area of the heat sink in the frame, the thermal influence to the side of the preamplifier chip is further reduced, even if the two chips are packaged in a common package. thereby, the packaging of a power amplifier chip having a further large output and a preamplifier chip in a single package can be realized.

Further, in case that the area of the heat sink is located in an area where the power amplifier chip is mounted, at the opposite side with respect to an area where the preamplifier chip is mounted, the thermal influence to the side of the preamplifier chip is suppressed without providing the above mentioned linear passage, even if the two chips are packaged in a common package.

Thereby, even when a high output amplifier outputs a high output or the heat generated at the side of the power amplifier chip increases and varies because low tone sound intensification, the device is hardly affected by the thermal modulation thereby and even the intensification of low tone sounds can be realized.

Moreover, in a semiconductor device manufacturing process wherein the preamplifier chip and the power amplifier chip are packaged together, in a single frame, the two chips and the frame can be handled integrally in the same way as in the manufacturing process of one chip. Thus the packaging in a common package is facilitated.

As a result, in both cases the modulation at the side of the output is suppressed, characteristics with regard to signal distortion and cross talk are improved, the thermal noises are reduced, and possible sound quality reduction is prevented even when a high output amplifier is mounted. In particular, the invention is suitable for a semiconductor device for amplifying audio signals in which low tone sounds are intensified.

DESCRIPTION OF THE PREFERRED EMBODIMENTS

Figure 1:
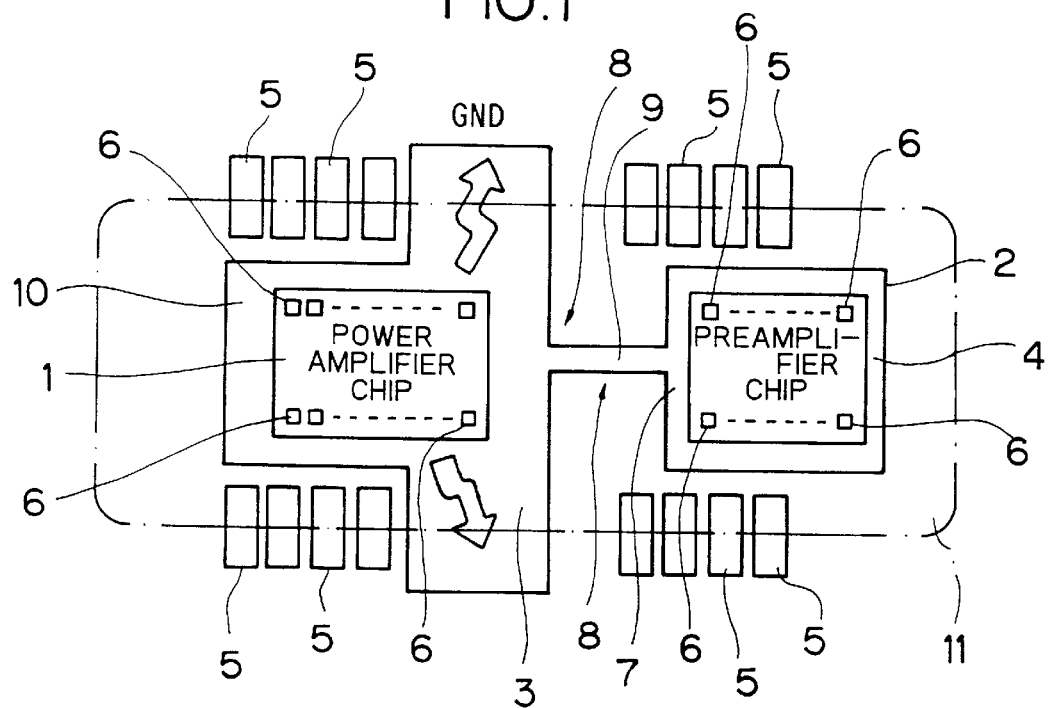
FIG. 1 is a view for explaining a packaged internal structure of one embodiment into which a semiconductor device for amplifying audio signals according to the present invention is applied.

FIG. 1 shows a plane view illustrating a state in which a package 11 (indicated by the framed dot and chain line) for a semiconductor device packaging a preamplifier chip and a power amplifier chip is removed, a power amplifier chip 1 and a preamplifier chip 2 are mounted on a frame 4 for heat radiation, and between these chips a heat sink area 3 for heat diffusion is provided. The heat sink area 3 extends to the outside from the package 11 and serves as a heat radiation terminal which leads heat to exterior of the package 11 and as a grounding terminal. The terminal is connected to a large grounding pattern through the connection to the ground GND or contact-connected to a heat radiation plate via a thermal conductive adhesive. Further, in the power amplifier chip 1 a power amplifier of a comparatively high output including a low tone sound intensifying circuit is provided. Still further, in the preamplifier chip 2 an equalizer circuit for amplifying small signals and a mixing circuit are provided. Still further, signal input from the preamplifier chip 2 to the power amplifier chip 1 can be performed via internal leads within the package 11, however such signal input is usually performed at the outside of the package 11 via lead terminals 5,5,5, - - - .

The heat sink area 3 is a region formed adjacent to an area 10 in the frame 4 where the power amplifier chip 1 is mounted.

The lead terminals 5,5,5, - - - are formed together with the frame 4 and pads 6,6,6 - - - on the respective chips are connected to the corresponding lead terminals 5,5,5 - - - via respective wire bondings (not shown) and are led out to the exterior of the package 11 (the framed dot and chain line).

The frame 4 is provided with cut-out portions 8,8 which are formed by cutting out the frame 4 from both outsides thereof between the heat sink area 3 and an area 7 where the preamplifier chip 2 is mounted and a passage 9 is formed by these cut-out portions 8,8. Through the connection between the heat sink area 3 and the area 7 where the preamplifier chip 2 is mounted in the frame 4 via the linear passage 9, the area 7 where the preamplifier chip 2 is mounted and the area 10 where the power amplifier chip 1 is mounted are connected and integrated. The heat generated by the power amplifier chip 1 or the thermal influence modulated by low tone sounds is suppressed by the passage 9. Such suppression is realized by the narrow passage 9 with respect to the broad heat sink area 3, in that the thermal resistance of the narrow passage 9 is larger than that of the heat sink area 3.

These power amplifier chip 1, preamplifier 2 and frame 4 are packaged by the package 11 indicated by a dot and chain line.

Figure 2:
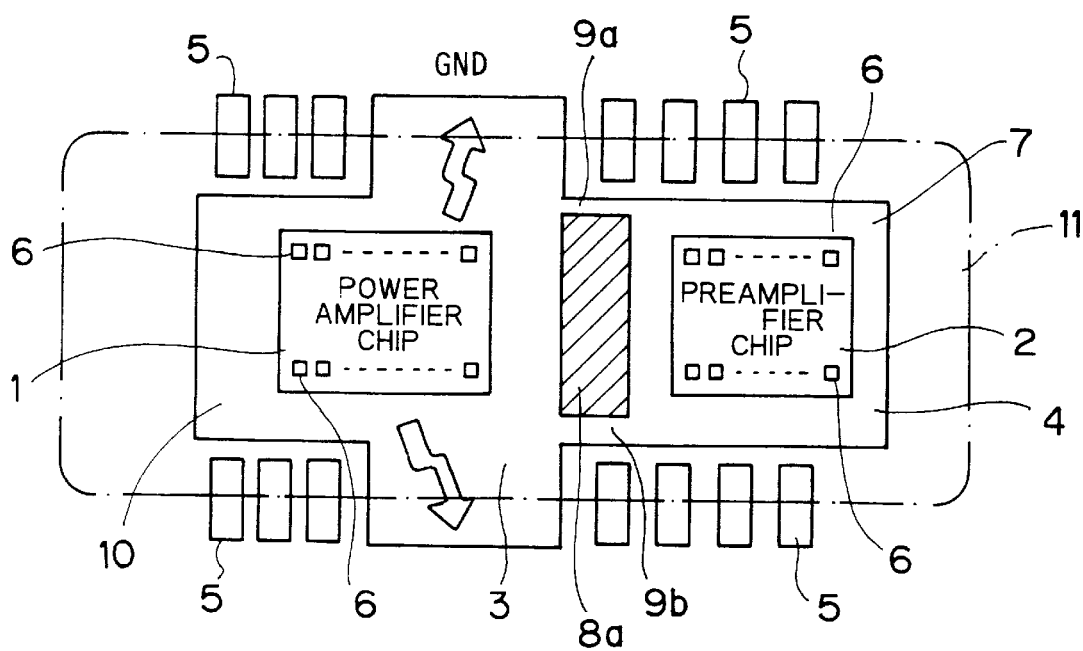
FIG. 2 is a view for explaining a packaged internal structure of another embodiment into which a semiconductor device for amplifying audio signals according to the present invention is applied.

In FIG. 2, in stead of providing the above mentioned cut-out portions 8 by cutting out the frame 4 from both outsides thereof, an opening portion 8a is provided inside the frame 4 to form an equivalent portion. With the provision of the opening portion 8a two passages 9a, 9b are formed between the heat sink area 3 and the area where preamplifier chip 2 is mounted. The functional effect of the two passages 9a, 9b is equivalent as that of the passage 9, however, when using the heat sink area 3 which is led out as an external terminal as a grounding terminal connected to the ground, the thermal resistance from the area 7 to the ground GND can be reduced in comparison with that in FIG. 1 embodiment. Further, when viewing the frame 4 as an integrated body, the area 7 and the area 10 in FIG. 2 embodiment are further firmly connected.

Figure 3:
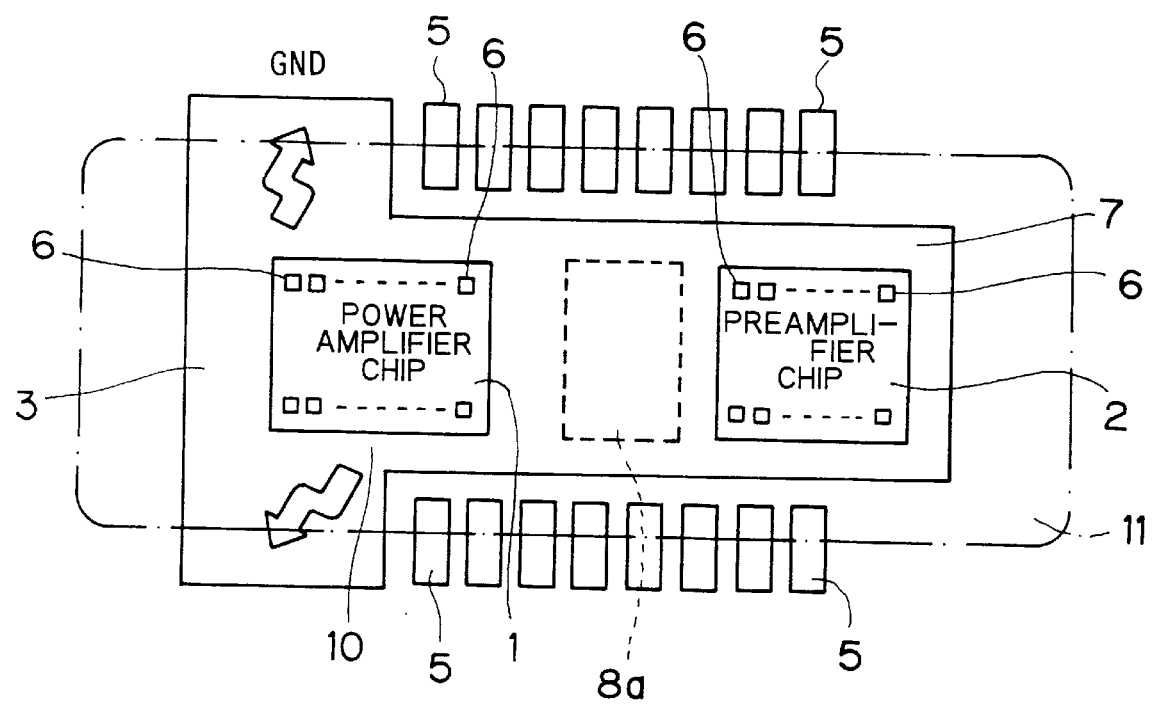
FIG. 3 is a view for explaining a packaged internal structure of still another embodiment into which a semiconductor device for amplifying audio signals according to the present invention is applied.

In FIG. 3, instead of providing the above mentioned cut-out portions 8, the location of the heat sink area 3 is modified, in that the heat sink area 3 is formed at an opposite end area in the area 10 where the power amplifier chip 1 is mounted with respect to the area 7 where the preamplifier chip 2 is mounted The heat sink area 3 is packaged in a common package together with the power amplifier chip 1 and the preamplifier chip 2.

In particular, in this embodiment a narrow passage having a high thermal resistance is not provided between the area 10 where the power amplifier chip 1 is mounted and the area 7 where the preamplifier 2 is mounted in the frame 4. However, an opening portion 8a as indicated by a dotted line can be provided between the power amplifier chip 1 and the preamplifier chip 2 as in FIG. 2 embodiment.

We claim:

1. A semiconductor device for amplifying audio signals comprising;
    a preamplifier chip for amplifying small signals representing audio signals;
    a power amplifier chip which receives and power-amplifies the amplified audio signals from said preamplifier chip and outputs the same; and
    a frame where said preamplifier chip and said power amplifier chip are mounted and which includes a heat sink area connected to a terminal for heat radiation, wherein said heat sink area is located adjacent to an area in the frame where the power amplifier chip is mounted, and said preamplifier chip, said power amplifier chip and said frame are packaged together.
2. A semiconductor device for amplifying audio signals according to claim 1, wherein the area in said frame where said power amplifier chip is mounted and the area in said frame where said preamplifier chip is mounted are connected via a linear passage.
3. A semiconductor device for amplifying audio signals according to claim 2, wherein said heat sink area is located in the area where said power amplifier chip is mounted at the side of said preamplifier chip and said linear passage is provided between said heat sink area and said preamplifier chip.
4. A semiconductor device for amplifying audio signals according to claim 2, wherein said linear passage is formed by providing a cut-out region at the outside of said frame.
5. A semiconductor device for amplifying audio signals according to claim 2, wherein said linear passage is formed by providing a cut-out region at the inside of said frame.
6. A semiconductor device for amplifying audio signals according to claim 1, wherein said heat sink area is located in the area where said power amplifier chip is mounted, at the opposite side from said preamplifier chip.
7. A semiconductor device for amplifying audio signals according to claim 1, wherein a circuit for intensifying low tone sounds is provided in said power amplifier chip.

* * * * *